(12) United States Patent
Argandona et al.

(10) Patent No.: US 7,084,427 B2
(45) Date of Patent: Aug. 1, 2006

(54) SYSTEMS AND METHODS FOR OVERLAY SHIFT DETERMINATION

(75) Inventors: Patricia Argandona, Poughkeepsie, NY (US); Faisal Azam, Fishkill, NY (US); Andrew Lu, Poughkeepsie, NY (US); Helen Wang, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,175

(22) Filed: Jun. 10, 2003

(65) Prior Publication Data
US 2005/0019966 A1    Jan. 27, 2005

(51) Int. Cl.
*H01L 23/58* (2006.01)

(52) U.S. Cl. .......................... 257/48; 257/797

(58) Field of Classification Search .................. 438/17, 438/18; 257/48, 797; 324/71.1, 71.5; 700/121; 702/94–95
See application file for complete search history.

(56) References Cited

U.S. PATENT DOCUMENTS

| | | | |
|---|---|---|---|
| 3,808,527 A * | 4/1974 | Thomas | 324/716 |
| 4,347,479 A | 8/1982 | Cullet | |
| 4,386,459 A * | 6/1983 | Boulin | 438/11 |
| 4,399,205 A | 8/1983 | Bergendahl | |
| 4,437,760 A * | 3/1984 | Ausschnitt | 355/133 |
| 4,475,811 A * | 10/1984 | Brunner | 355/133 |
| 4,538,105 A | 8/1985 | Ausschnitt | |
| 4,571,538 A | 2/1986 | Chow | |
| 5,082,792 A * | 1/1992 | Pasch et al. | 438/17 |
| 5,247,262 A * | 9/1993 | Cresswell et al. | 324/716 |
| 5,383,136 A * | 1/1995 | Cresswell et al. | 702/97 |
| 5,390,420 A | 2/1995 | Schultz | |
| 5,648,661 A * | 7/1997 | Rostoker et al. | 257/48 |
| 5,699,282 A * | 12/1997 | Allen et al. | 702/85 |
| 5,770,995 A | 6/1998 | Kamiya | |
| 5,998,226 A | 12/1999 | Chan | |
| 6,080,597 A * | 6/2000 | Moon | 437/17 |
| 6,242,757 B1 * | 6/2001 | Tzeng et al. | 257/48 |
| 6,380,554 B1 * | 4/2002 | Bush et al. | 257/48 |
| 6,383,827 B1 * | 5/2002 | Lukanc et al. | 438/18 |
| 6,393,714 B1 | 5/2002 | Look et al. | |
| 6,423,555 B1 * | 7/2002 | Babcock | 438/14 |
| 6,623,996 B1 * | 9/2003 | Nanba | 438/17 |
| 6,716,653 B1 * | 4/2004 | Look et al. | 438/14 |

FOREIGN PATENT DOCUMENTS

| JP | 2005445 A | 1/1990 |
|---|---|---|
| JP | 4032216 A | 2/1992 |

OTHER PUBLICATIONS

D.S. Perloff, "A Van der Pauw sturcture for determining mask superposition errors on semiconductor slices", Solid State Electronics Aug. 21, 1978, pp. 1013-1018.*

(Continued)

*Primary Examiner*—Evan Pert
(74) *Attorney, Agent, or Firm*—Joseph P. Abate, Esq.; Greenblum & Bernstein, P.L.C.

(57) ABSTRACT

The systems and methods enable the determination of the magnitude and direction of overlay of at least two elements in two layers. Overlay measurements along two axes can be obtained using four probe pads and without requiring a decoder. Overlay measurements along a single axis can be obtained using three probe pads and without requiring a decoder. The systems and methods according to this invention require less space and are more time efficient than conventional measurement structures. In the systems and methods of this invention, offsets in a direction are calculated from resistance measurements.

10 Claims, 8 Drawing Sheets

OTHER PUBLICATIONS

D.H. Leebrick et al., "An Electrical Alignment Test Device and Its Use in Investigating Processing Parameters", Kodak Microelectronics Seminar proceedings, interface '77, Oct. 1977, pp. 66-83.*

T.J. Russel et al., "A Comparison of Electrical and Visual Alignment test Sturctures for Evaluating Photomask Alignment in Integrated Circuit Manufacturing", International Electron Devices Meeting, Dec. 1977, pp. 7A to 7F.*

D.R. Thomas et al., "An Electrical Photolithographic Alignment Monitor", IBM disclosure in 1974 Government Microcircuit Applications Conference: digest of papers, pp. 196-197.*

Publication; Hybrid Optical-Electrical Overlay Test Structure [for CMOS], Cresswell, M.W. et al., Microelectronic Test Structures, 1996. Proceedings 1996 IEEE International Conference on Mar. 25, 1996-Mar. 28, 1996.

Kern Rim, et al., "Transconductance Enhancement in Deep Submicron Strained-Si n-MOSFETs", International Electron Devices Meeting, 26, 8, 1, IEEE, Sep. 1998.

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale-System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

* cited by examiner

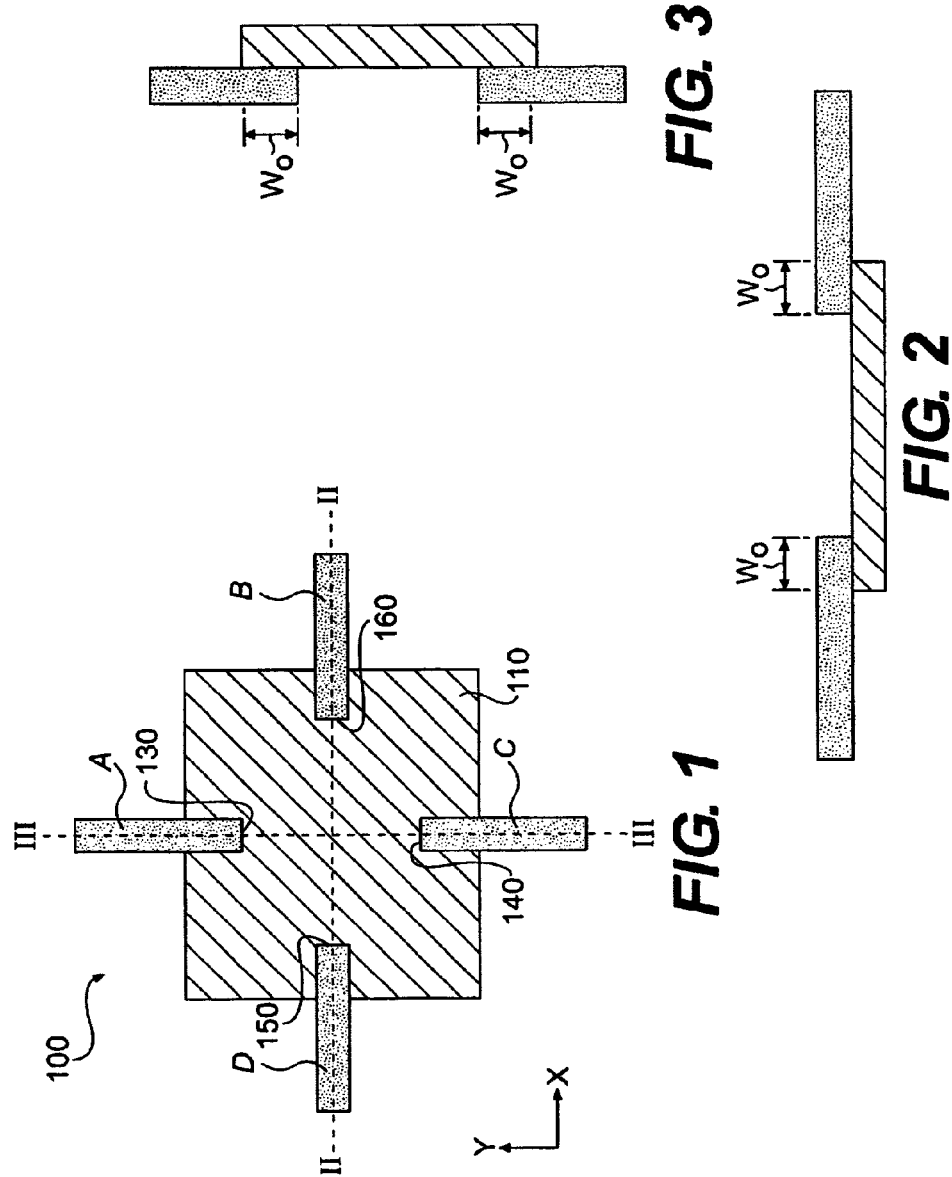

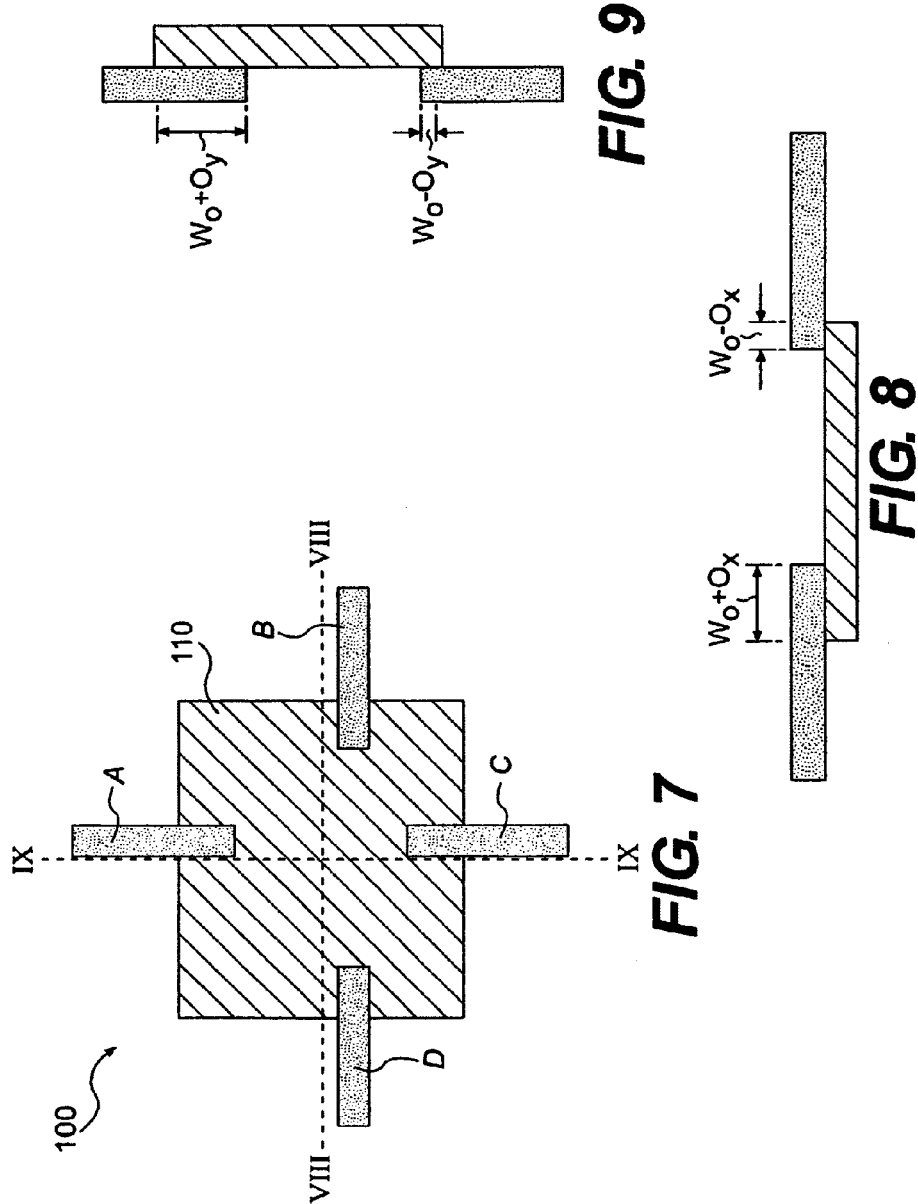

SYSTEMS AND METHODS FOR OVERLAY SHIFT DETERMINATION

BACKGROUND OF INVENTION

This invention relates to systems and methods for overlay shift determination, and in particular, to systems and methods for determining the magnitude and direction of an error in the alignment of at least one first layer with at least one second layer of a semiconductor device.

Semiconductor devices are manufactured with a plurality of different layers and a plurality of different processing steps, such as, for example, masking, resist coating, deposition and etching. During the semiconductor manufacturing process, many materials are provided on the semiconductor device and portions of the provided materials are removed by etching, for example, in order to form elements of the integrated circuit. For example, circuit elements are formed using patterned masks which expose and protect respective regions of various layers to form an integrated circuit. These patterned masks, for example, should be substantially, and ideally completely, aligned with the respective layer.

Ideally the respective layers and/or patterned masks of an integrated circuit, for example, are perfectly aligned. However, perfect alignment is difficult, and nearly impossible to achieve. Errors in the alignment of one layer with another layer during the manufacturing process of semiconductor devices can occur for a wide-variety of reasons. For example, errors made during the manufacturing process may occur as a result of alignment noise, stage scanning problems, lens distortions, and wafer stage inaccuracies.

The performance of the semiconductor device, however, depends on the proper alignment of the patterned masks with each of the layers forming the semiconductor device. As integrated circuits become smaller and smaller the proper alignment between layers becomes even more important. If the layers and/or masks for forming the semiconductor device and the integrated circuits formed thereon are not aligned properly, the semiconductor device may fail to operate properly, if at all.

There are a variety of known methods for detecting the misalignment between layers of semiconductor devices. By way of example, it is known to use resistance based alignment for magnetoresistive elements, where the sheet resistivity of each of the two alignment test structures is used to detect the misalignment of the elements. However, these types of designs require large structures and are dependent on processing variations. Other methods include ways to determine if the openings located in the contact layer and the interconnect layer are misaligned. However, these methods do not determine the direction or the magnitude of the misalignment.

In still other methods, mask-alignment test structures are used for measuring the alignment of superimposed elements formed on and within a semiconductor element. In order to determine the magnitude and extent of misalignment in both the X and Y directions, for example, in these methods, it is necessary to have four of the structures disclosed. Further, in order to determine the magnitude and extent of the misalignment in accordance with such methods approximately sixteen steps and seven probe pads are required in the case where a decoder is not used and approximately four steps and ten probe pads are required in the case where a decoder is used. Thus, such devices are large in size and/or time consuming due to the number of steps required to determine the magnitude of the misalignment. This is time consuming and costly. It is also known to use optical methods to determine error in misalignment. However, optical methods for determining error in misalignment are generally slower than electrical test structures.

SUMMARY OF INVENTION

In an aspect of the invention, an overlay shift determination structure has a plurality of probe members in a first layer and an overlay target in a second layer of an integrated device. At least a portion of the plurality of probe members overlaps and is connected to the overlay target and the first layer includes a first axis and a second axis which is perpendicular to the first axis. A first probe member and a second probe member of the plurality of probe members are disposed along a first axis and a third probe member of the plurality of probe members is disposed perpendicular to the first probe member and the second probe member.

In another aspect of the invention, a method is provided for measuring misalignment between at least two layers of an integrated circuit by applying a current between a plurality of probe members in a first layer where a first probe member and a second probe member of the plurality of probe members are substantially aligned along a first axis and partially overlap an overlay target in a second layer. The method measures a voltage across the plurality of probe members where at least a voltage across the first probe member and a third probe member which is disposed perpendicular to the first axis and a voltage across the second probe member and the third probe member are measured. The method further determines an amount of misalignment between the first layer and the second layer along at least one of the first axis and the second axis based on the measuring steps.

In another aspect, the invention provides a computer program product comprising a computer usable medium having readable program code embodied in the medium, the computer program product includes a first computer program code for applying a current between a plurality of probe members in a first layer, wherein at least two of the probe members are aligned along a first axis and partially overlap an overlay target in a second layer, a second computer program code for measuring a voltage across the plurality of probe members where the measured voltage is between at least one of the two aligned probe members and a third probe member disposed perpendicular to the first axis, and a third computer program code for determining an amount of misalignment between the first layer and the second layer along at one of the first axis and the second axis based on the measured voltages.

BRIEF DESCRIPTION OF DRAWINGS

Various exemplary embodiments of this invention will be described in detail with reference to the following figures, wherein:

FIG. 1 illustrates an aligned embodiment of an overlay shift determination structure according to this invention;

FIG. 2 illustrates a cross-sectional view along line II—II of the overlay shift determination structure shown in FIG. 1;

FIG. 3 illustrates a cross-sectional view along line III—III of the overlay shift determination structure shown in FIG. 1;

FIG. 7 illustrates an improperly aligned overlay shift determination structure according to the embodiment of this invention;

FIG. 8 illustrates a cross-sectional view along line VIII—VIII of the improperly aligned overlay shift determination structure shown in FIG. 7;

FIG. 9 illustrates a cross-sectional view along line IX—IX of the improperly aligned overlay shift determination structure shown in FIG. 7;

DETAILED DESCRIPTION

Electrical characteristics of an overlay shift determination structure are obtained, for example, by using wafer testers and wafer probers connected to the probe members of the overlay shift determination structure. For example, the probe members of the overlay shift determination structure are connected to electrical test structures and wafer testers in order to make electrical device characterizations. A number of different types of wafer testers and wafer probers can be utilized and are contemplated with the present invention, none of which are limiting factors for the present invention. Wafer testers, such as, for example, HP4062 (200 mm) and HP4073 (300 mm) may be used. Each of these exemplary testers comprise a computer with 4 gigabytes of hard disk space and 128 megabytes of system memory.

The test instrumentation includes a parametric analyzer, such as, for example, an HP-4142, a capacitance meter, such as, for example, an HP-3458A, a digital multi meter, such as, for example an HP-3458, and a ninety-six position switch matrix. The HP-4142, for example, contains four source-measurement units, two voltage monitors, two voltage sources, and a differential voltmeter. The source measurement units can source up to 100 volts and 100 mA. Low current measurements may be down to a level of about 15 pA. It should be understood that the wafer testers disclosed above are provided for illustrative purposes and do not limit the present invention to such wafer testers.

As to wafer probers, KLA model 1200"s, KLA model ElectroGlas 4085"s and TSK UF200"s, for example, may be used with the various systems and methods according to this invention. These probers can automatically probe two cassettes of 25 wafers each. The wafer probers include a thermo-chuck which allow elevated temperature measurements to about 200 degrees Celsius. Such wafer probers may be used with the embodiments of the systems and methods according to this invention. It should again be understood that the wafer testers and/or probers disclosed above are provided for illustrative purposes and do not limit the present invention to such wafer testers.

Figure 4:
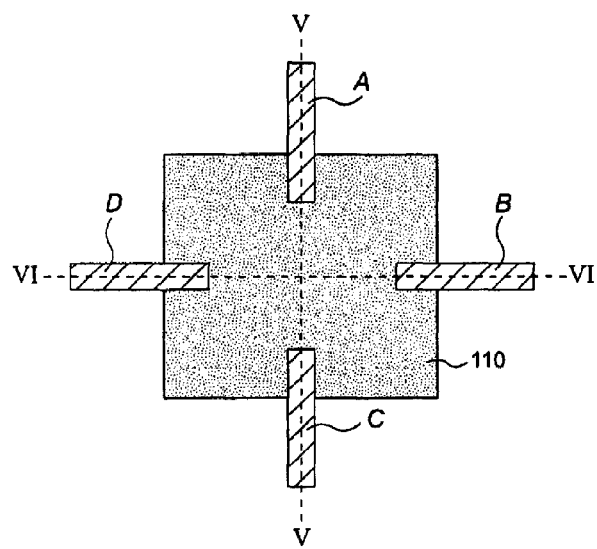
FIG. 4 illustrates an exemplary embodiment of an overlay shift determination structure according to this invention.
Figure 6:
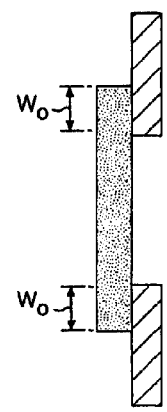
FIG. 6 illustrates a cross-sectional view along line VI—VI of the overlay shift determination structure shown in FIG. 5.
Figure 5:
FIG. 5 illustrates a cross-sectional view along line V—V of the overlay shift determination structure shown in FIG. 4.

Now referring to FIG. 1, an electrical overlay shift determination structure 100 according to this invention is shown. The electrical overlay shift determination structure 100 has a plurality of probe members A, B, C, D and an electrical overlay target 110. Each of the probe members A, B, C, D overlaps at least a portion of the electrical overlay target 110. In this embodiment, four probe members are shown but three or more probe members are also contemplated for use with the present invention. The four probe members A, B, C, D are in a first layer and the electrical overlay target 110 is in a second layer, and the probe members are in electrical contact with the electrical overlay target 110. Similarly, as shown in FIGS. 4–6, the overlay target may be in the first layer and the probe members may be in the second layer.

In the embodiment of the overlay shift determination structure shown in FIGS. 1–3, at least the first layer of the overlay shift determination structure 100 is symmetrical about both the X and the Y axes of the first layer. The overlay shift determination structure which is shown in FIGS. 1–3 is properly aligned. In FIG. 1, line II—II represents the X-axis of the first layer and line III—III represents the Y-axis of the first layer. As shown in FIG. 1, the distance between an innermost point 130 along an outside border of the first probe member A, which overlaps with the overlay target 110, and an innermost point 140 along an outside border of the second probe member B, which overlaps with the overlay target 110, is the same as the distance between an innermost point 150 along an outside border of the third probe member C and an innermost point 160 along an outside border of the fourth probe member D. However, as discussed below, it should be understood that it is not necessary for the first layer of the overlay shift determination structure 100 to be symmetrical about both the X and the Y axes of the first layer.

FIGS. 2 and 3, showing cross sectional views along lines II—II and III—III, respectively, show the overlap length of the probe members A, B, C, D with the overlay target 110 being equal or substantially equal. That is, for example, the overlap length for each probe member along the Y-axis is $W_o$ and the overlap length for each probe member along the X-axis is $W_o$. Further, as shown in FIGS. 1–3, the width of each of the probe members A, B, C, D is substantially, and in an embodiment, completely identical. Thus, when the overlap length of the probe members A, B, C, D with the overlay target 110 is substantially, and in an embodiment completely, identical (i.e., when the first layer and the second layer of the overlay shift determination structure are properly aligned), the contact area of each of the probe members with the overlay target is substantially, and in an embodiment, completely identical.

FIGS. 1–3 illustrate an embodiment of an overlay determination structure according to this invention where the first layer and the second layer of the overlay shift determination structure is properly aligned. More particularly, as shown in FIGS. 1–3, the overlap area of each of the probe members A, B, C, D are substantially situated about the X and Y axes of both the first layer and the overlay target, thus showing proper alignment. However, as discussed below, if the first and second layers are improperly aligned, the probe members A, B, C, D are substantially symmetrically situated about the X and Y axes of the first layer, but the probe members A, B, C, D are not symmetrically situated about the X and Y axes of the overlay target.

The contact resistance of each probe member A, B, C, D with the overlay target is dependent on the contact area (i.e., the portion of the probe member which overlaps the overlay target). In this exemplary embodiment, when the first layer and the second layer of the overlay shift determination structure are properly aligned, the contact of each probe member A, B, C, D with the overlay target 110 are substantially, and in an embodiment completely, identical. By having such an overlay shift determination structure with four probe members, for example, which each have substantially, and in an embodiment, completely identical contact areas with the overlay target, only 3 measurements need to be made and the calculations for determining the amount of misalignment are easier.

However, in another exemplary embodiment of this invention having four probe members, for example, the contact area for each pair of probe members aligned along an axis may be substantially, and in an embodiment, completely identical when the first layer and the second layer of the overlay shift determination structure are properly aligned. Similarly, in another exemplary embodiment of this invention having three probe members, at least the contact resistance of the two probe members aligned along a first axis should be substantially, and in an embodiment, completely identical.

Irrespective of the actual embodiment of the overlay shift determination structure, however, the contact resistance of the probe members when the first layer and the second layer are not properly aligned is used to determine the amount of misalignment between the first and second layers of the overlay shift determination structure.

By having a first layer which is substantially symmetrical about the X-axis and the Y-axis, the total contact resistance across each of the axes is the same irrespective of whether or not the first layer and the second layer of the overlay shift determination structure are properly aligned. Thus, as set forth above, it is possible to determine both the X and Y translation/misalignment errors with only three measurements. By measuring three voltages, it is possible to determine the resistances across three of the probe members based on the known applied currents. It should be understood by one of ordinary skill in the art that the currents applied to determine the voltages across each pair of probe members, for example, may be the same amount or a different amount. Also, by determining at least three resistances across three different pairs of probe members, it is possible to determine the resistances of each of the overlap areas (i.e., contact areas) of each probe members and the overlay target 110 by solving four equations using three known values and one unknown variable.

The following example of a method for obtaining the overlay shift amount (i.e., the misalignment amount) may be carried out in any order of measurement and to any combination of the probe members. In addition, it should be understood that the applied currents, for example $I_{AB}$, $I_{CD}$ may be the same or different. For example, it is possible to determine both the X and Y translation errors by (1) applying a current $I_{DA}$ through D and A and measuring the voltage across B and C to determine the resistance across B and C (i.e., $R_{BC}$); (2) applying a current $I_{AB}$ through A and B and measuring the voltage across C and D to determine the resistance across C and D (i.e., $R_{CD}$); (3) applying a current $I_{CD}$ through C and D and measuring the voltage across A and B to determine the resistance across A and B (i.e., $R_{AB}$); and (4) solving the following matrices to determine the resistances ($R_A$, $R_B$, $R_C$, $R_D$) of each of the overlapped regions of the probe members and the overlay target (110).

$$\begin{bmatrix} 1 & 1 & 0 & 0 \\ 0 & 1 & 1 & 0 \\ 0 & 0 & 1 & 1 \\ 1 & -1 & 1 & -1 \end{bmatrix} \begin{bmatrix} R_A \\ R_B \\ R_C \\ R_D \end{bmatrix} = \begin{bmatrix} R_{AB} \\ R_{BC} \\ R_{CD} \\ 0 \end{bmatrix}$$

The above matrix applies when resistances $R_{AB}$, $R_{BC}$, and $R_{CD}$ are measured. If a different combination of resistances are measured a similar matrix may be used. It should be understood by one of ordinary skill in the art that the present invention is not intended to be limited by the matrices shown herein. It should be understood that one skilled in the art could vary the equations contained in the matrices based on the known variables. The resistances $R_A$, $R_B$, $R_C$, $R_D$ determined by solving the above matrices are then used to determine the misalignment along the X-axis $O_X$ and/or the misalignment along the Y-axis $O_Y$ using the following equations:

$$O_X = \frac{R_o w_o}{2}\left(\frac{1}{R_B} - \frac{1}{R_D}\right)$$

$$O_Y = \frac{R_o w_o}{2}\left(\frac{1}{R_A} - \frac{1}{R_C}\right)$$

where:

$$R_0 = \frac{(R_A + R_C)}{2} = \frac{(R_B + R_D)}{2}$$

The embodiment is described above with four probe members. However, it is possible, for example, to have an overlay shift determination structure 100 according to this invention with three probe members. If a three probe member overlay shift determination structure is used it is possible to determine the translation error along either the X-axis or the Y-axis. For example, with an overlay shift determination structure having three probe members A, B, C shown in FIG. 1, it is possible to determine the translation error along the Y-axis $O_Y$.

The contact resistance between probe member and the overlay target 110 is obtained by: (1) passing current $I_{AC}$ through probe member A and probe member C and measuring the voltage across at least one of A and C or A and B to determine $R_A$; (2) passing current $I_{CA}$ through C and A and measuring the voltage across at least one of A and C or C and B to determine $R_C$; and (3) solving the following matrices to determine the values for the contact resistance of each probe member A, B, C with the overlay target:

$$\begin{bmatrix} 1 & 1 & 0 \\ 0 & 1 & 1 \\ 1 & 0 & 1 \end{bmatrix} \begin{bmatrix} R_A \\ R_B \\ R_C \end{bmatrix} = \begin{bmatrix} R_{AB} \\ R_{BC} \\ R_{AC} \end{bmatrix}$$

The resistance $R_{AC}$ across probe members A and C may be measured or calculated based on the known resistance across the axis, for example. With the determined contact resistances $R_A$, $R_B$, $R_C$, the following equation may be used to determine the misalignment along the Y-axis $O_Y$:

$$O_Y = \frac{R_o w_o}{2}\left(\frac{1}{R_A} - \frac{1}{R_C}\right)$$

where:

$R_o = (R_A + R_C)/2$, $O_Y$ (nm) is the translation error along the Y-axis; $R_o$ (ohm/cm$^2$) is the designed ohmic contact resistance, $w_o$ (nm) is the designed overlap; $R_A$ (ohm/cm$^2$) is the contact resistance on arm A, $R_B$ (ohm/cm$^2$) is the contact resistance on arm B and $R_C$ (ohm/cm$^2$) is the contact resistance on arm C in order to calculate the translation error in the Y-direction $O_Y$. A similar process can be carried out to determine the translation error in the X-direction.

If, as discussed above, the patterned masks are properly aligned with the respective materials, the overlay shift determination structure 100 is perfectly aligned such that the length of the overlap regions of each of the probe members A, B, C, D with the electrical overlay target 110 is substantially the same, as shown in FIGS. 1–6. For example, as shown in FIG. 2 the probe members A, B, C, D overlap the electrical overlay target by an identical length $W_o$.

However, depending on the direction of misalignment, the length of overlap of the probe members situated along one axis and/or the length of overlap of the probe members situated along both axes may be different. For example, as shown in FIG. 8, if the first layer is shifted an amount $O_x$ in the X-direction, then the length of overlap of probe member D is $W_o+O_X$ and the length of overlap of probe member B is $W_o\ O_X$. Similarly, as shown in FIG. 9, if the first layer is shifted an amount $O_Y$ in the Y-direction, then the length of overlap of probe member A along the Y-axis is $W_o+O_Y$ and the length of overlap of probe member C is $W_o\ O_Y$.

Referring still to FIGS. 1–3, the probe members A, B, C, D are in a layer which is situated above the layer in which the electrical overlay target 110. However, the overlay shift determination structure 100 is similarly operative if the probe members A, B, C, D are in a layer which is situated below the layer in which the electrical overlay target 110 exists, as shown in FIGS. 4–6.

The probe members in the embodiments of the systems and methods according to this invention may be of any size. However, the probe members should be as small as possible to keep the size of the overlay shift determination structure as small as possible. In the various exemplary embodiments of the systems and methods according to this invention, the size of the probe members A, B, C, D depend on the resolution capability of the lithography process used. For example, the probe members may be lines having a width of about 200 nm.

Additionally, in the embodiments of the systems and methods according to this invention, the probe members A, B, C, D and the electrical overlay target 110 can be made, for example, of doped n/p-Si, Tungsten, doped poly-Si, or other doped semiconductor materials, such as, for example, SiGe, GaAs, or other III–V semiconductors. Although the material for the first layer will usually be different from the material of the second layer, it is possible, for example, to have a overlay shift determination structure according to this invention in which the probe members A, B, C, D and the overlay target 110 are made of the same material. The material selected for the probe members A, B, C, D and/or the electrical overlay target 110 should allow for the measurement of the contact resistance between the probe members and the electrical overlay target. High resistance contact materials which have a resistance which is higher than the resistance caused by probing is used for the probe members A, B, C, D and the electrical overlay target 110.

FIGS. 7–9 show an embodiment of an overlay shift determination structure which is not properly aligned. However, as discussed above, due to the substantially symmetrical first layer, the total resistance across each axes of the overlay shift determination structure remains the substantially the same whether or not the overlapping region of each probe member is the same. As discussed above, when the first layer and the second layer are not properly aligned, the overlapping areas of at least two of the probe members A, B, C, D which are situated on the same axis are not substantially equal. Due to this misalignment, the contact area of each of the probe members A, B, C, D with the electrical overlay target 110 changes, and thus the resistance resulting from the overlapping condition changes. The amount of change of each of the contact areas depends on the extent of the misalignment. As shown in FIG. 7, due to the improper alignment of the layer having the probe members A, B, C, D with the layer having the electrical overlay target 110, the contact length of probe member D is $W_o+O_X$, the contact length of probe member B is $W_o\ O_X$, the contact length of the probe member A is $W_o+O_Y$ and the contact length of the probe member C is $W_o-O_Y$.

Figure 10:
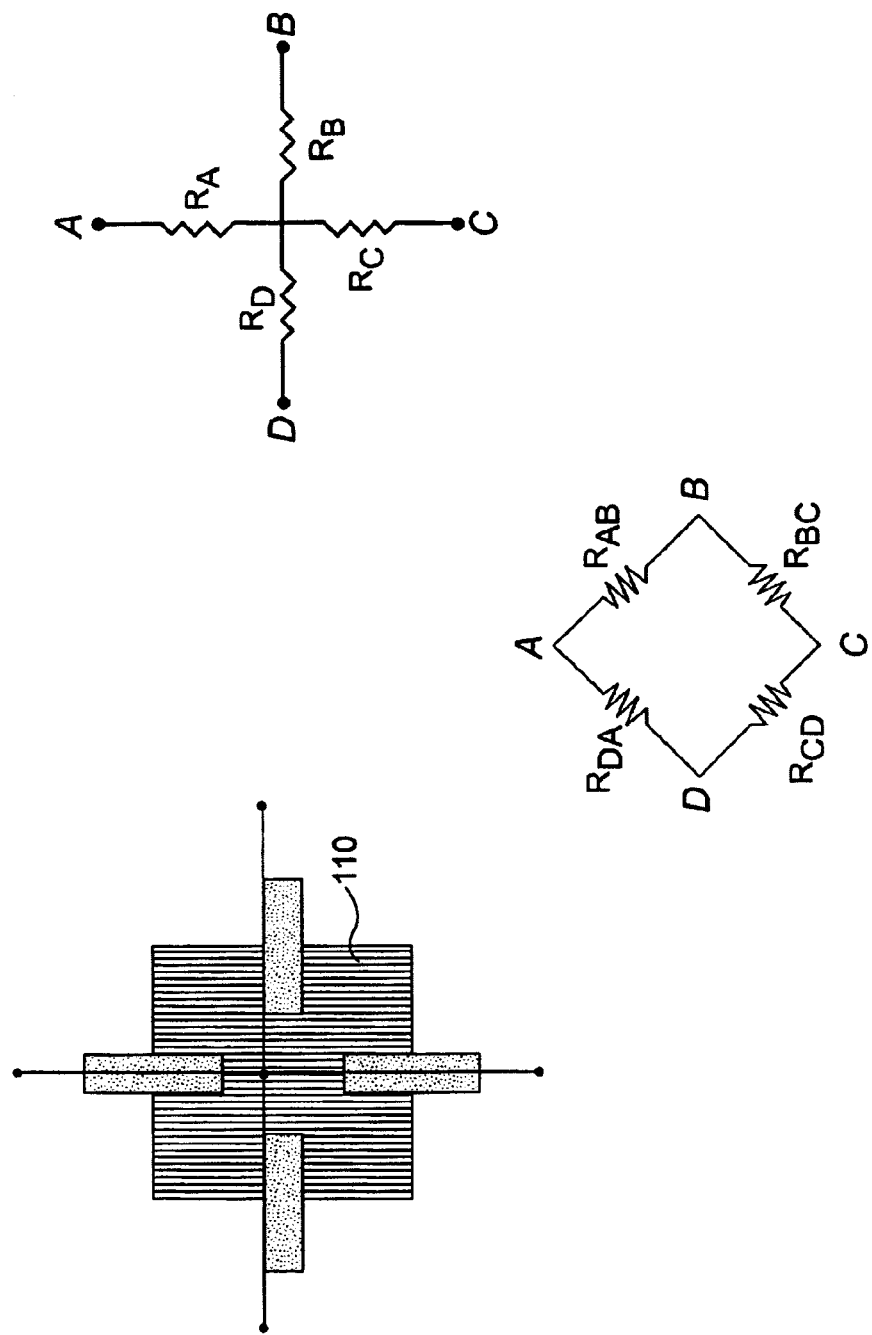
FIG. 10 illustrates schematic views of an overlay shift determination structure according to this invention.

FIG. 10 illustrates schematic views of an overlay shift determination structure according to this invention. The resistors $R_A$, $R_B$, $R_C$, $R_D$ represent the respective contact resistance between each of the probe members A, B, C, D and the electrical overlay target 110. The resistors $R_{AB}$, $R_{BC}$, $R_{CD}$, $R_{DA}$ represent the resistances across each of the corresponding pairs of probe members. At least three of the $R_{AB}$, $R_{BC}$, $R_{CD}$, $R_{DA}$ are measured by applying a current $I_{AB}$, $I_{BC}$, $I_{CD}$, $I_{DA}$ across at least three respective pairs of probe members (i.e., for example, across probe members A and B for current $I_{AB}$) and measuring the resistance across the other two probe members. For example, if current is applied across probe member A and B, the voltage across probe members C and D is measured to determine the resistance across probe member C and D (i.e., $R_{CD}$). Thus, for example, to determine the resistance across two adjacent probe members, current is applied to the other two probe members and the voltage is measure across the two adjacent probe member in order to determine the resistance across the two adjacent probe members. By measuring the resistances across $R_{AB}$, $R_{BC}$, and $R_{CD}$ it is possible to determine the contact resistances between each probe member and the overlay target, that is, $R_A$, $R_B$, $R_C$, $R_D$ by solving the following matrices:

$$\begin{bmatrix} 1 & 1 & 0 & 0 \\ 0 & 1 & 1 & 0 \\ 0 & 0 & 1 & 1 \\ 1 & -1 & 1 & -1 \end{bmatrix} \begin{bmatrix} R_A \\ R_B \\ R_C \\ R_D \end{bmatrix} = \begin{bmatrix} R_{AB} \\ R_{BC} \\ R_{CD} \\ 0 \end{bmatrix}$$

As discussed above, the alignment error along the X-axis $O_X$ and/or the Y-axis $O_Y$ can be determined by solving the following equations $$O_X = \frac{R_o w_o}{2}\left(\frac{1}{R_B} - \frac{1}{R_D}\right)$$

$$O_Y = \frac{R_o w_o}{2}\left(\frac{1}{R_A} - \frac{1}{R_C}\right)$$

where $O_Y$ (nm) is the translation error along the Y-axis; $O_X$ (nm) is the translation error along the X-axis; Ro (ohm/cm$^2$) is the designed ohmic contact resistance, $W_o$ (nm) is the designed overlap; $R_A$ (ohm/cm$^2$) is the contact resistance on arm A, $R_B$ (ohm/cm$^2$) is the contact resistance on arm B, $R_C$ (ohm/cm$^2$) is the contact resistance on arm C, and $R_D$ (ohm/cm$^2$) is the contact resistance on arm D in order to calculate the translation error in the Y-direction $O_Y$ and/or the translation error in the X-direction $O_X$.

Figure 11:
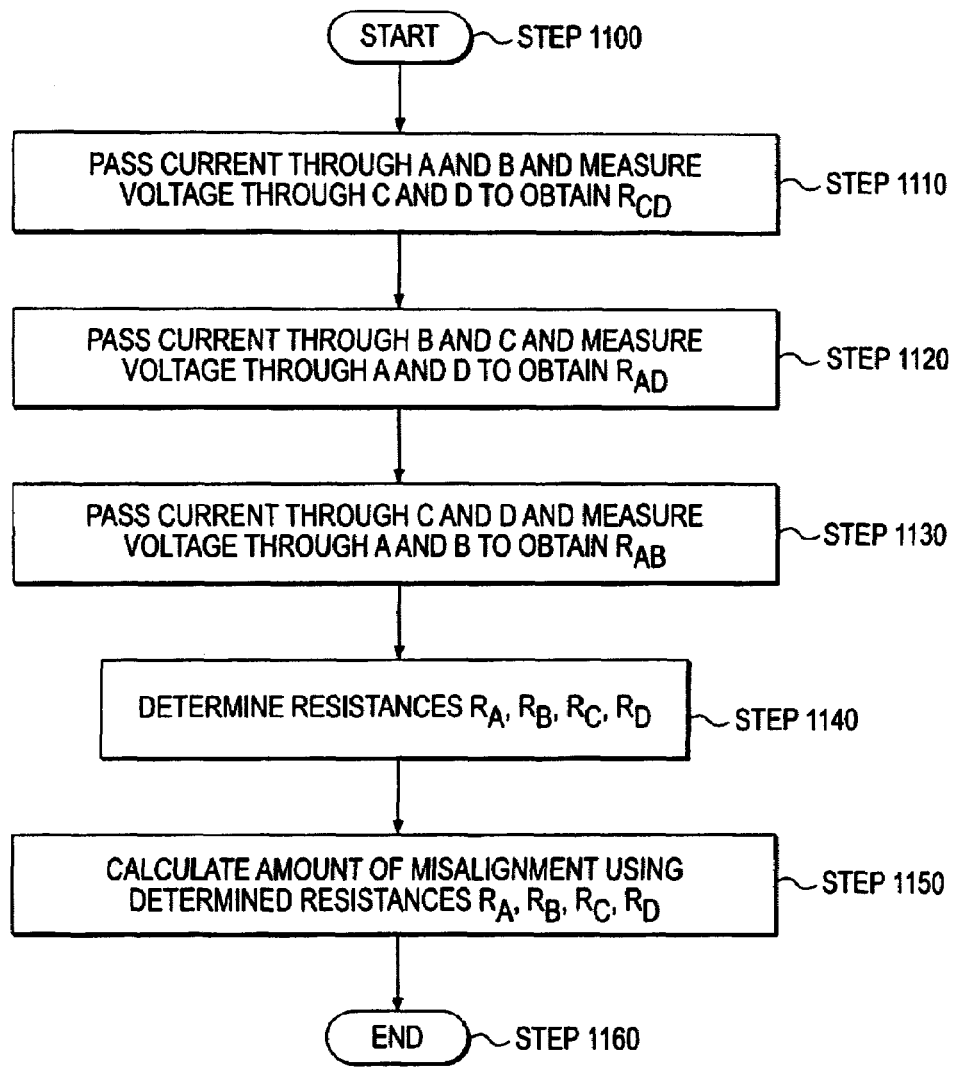
FIG. 11 illustrates a flow-chart outlining a method for determining an overlay shift according to this invention.

FIG. 11 illustrates a flow-chart outlining a method for determining an overlay shift according to this invention. The steps of FIG. 11 (and FIG. 12) may represent a high level block diagram of the present invention. FIG. 11 (and FIG. 12) is based on the schematically representative structure of FIG. 10. Additionally, the steps of FIG. 11 (and FIG. 12) may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network and may be stored in a database.

resistance $R_{AB}$. In step 1120, current $I_{DA}$ is passed from probe member D to probe member A and a second voltage $V_{BC}$ is measured across probe member B and probe member C in order to determine a second resistance $R_{BC}$. In step 1130, current $I_{AB}$ is passed from probe member A to probe member B and a third voltage $V_{CD}$ is measured across probe member C and probe member D in order to determine a third resistance $R_{CD}$.

In step 1140, the resistance of each overlapping region of each probe member and the overlay target is determined. The measured resistances $R_{CD}$, $R_{AD}$, $R_{AB}$ are used to determine the contact resistances $R_A$, $R_B$, $R_C$, $R_D$ by solving the matrices set forth above. In step 1150, the contact resistances $R_A$, $R_B$, $R_C$, $R_D$ are used to determine the amount of misalignment by solving the either or both of the equations set forth above. In step 1160, the process ends.

Figure 12:
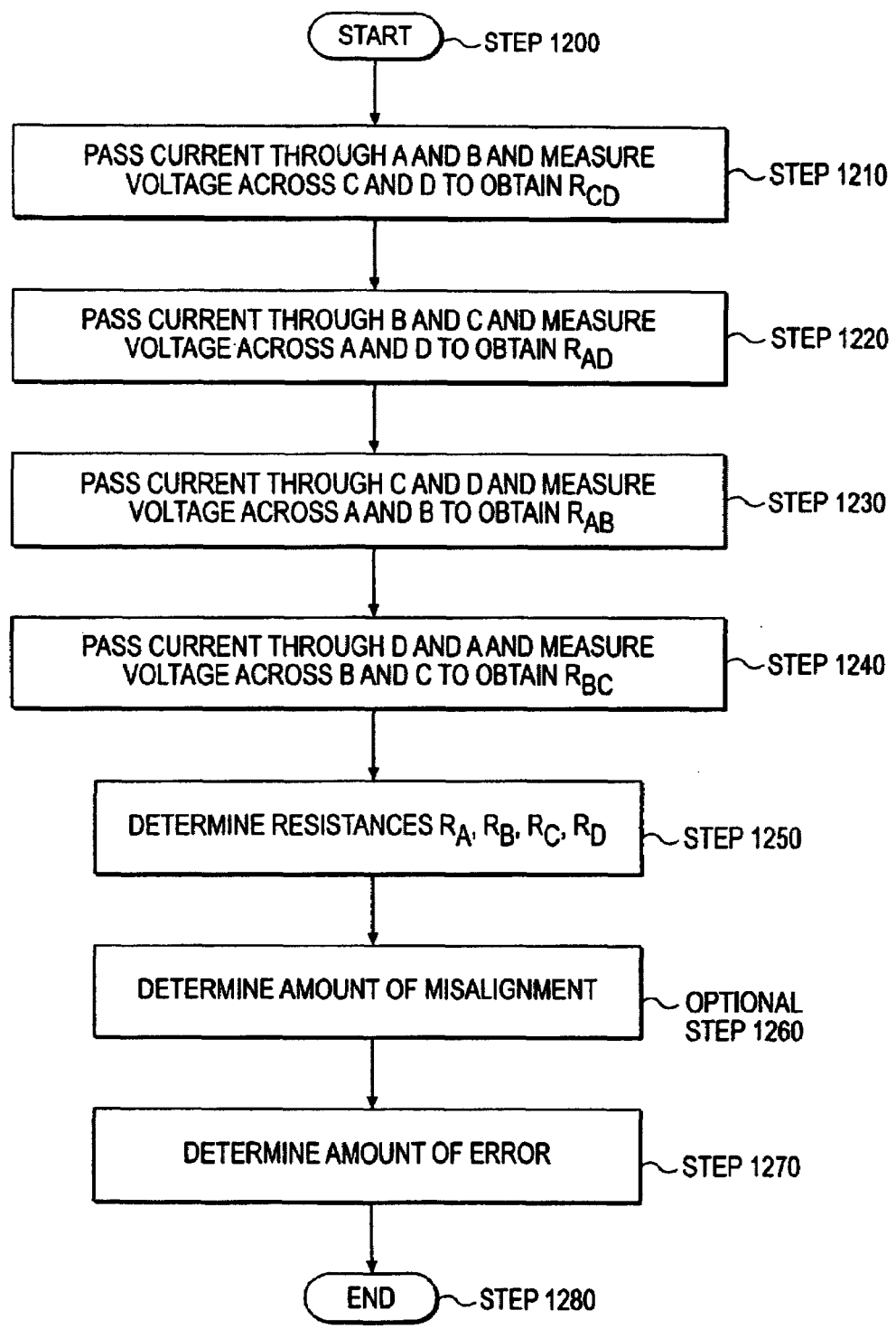
FIG. 12 illustrates a flow-chart outlining a method for determining an overlay shift according to this invention.

FIG. 12 illustrates a flow-chart outlining another method for determining an overlay shift according to this invention. In step 1200, the process starts. In step 1210, current $I_{AB}$ is passed from probe member A to probe member B and a first voltage $V_{CD}$ is measured across probe member D and probe member C in order to determine a first resistance $R_{CD}$. In step 1220, current $I_{BC}$ is passed from probe member B to probe member C and a second voltage $V_{AD}$ is measured across probe member A and probe member D in order to determine a second resistance $R_{AD}$. In step 1230, current $I_{CD}$ is passed from probe member C to probe member D and a third voltage $V_{AB}$ is measured across probe member A and probe member B in order to determine a third resistance $R_{AB}$. In step 1240, current $I_{DA}$ is passed from probe member D to probe member A and a third voltage $V_{BC}$ is measured across probe member B and probe member C in order to determine a third resistance $R_{BC}$. In step 1250, the resistance of the overlapping areas of each probe member with the overlay target are determined using the following matrices:

$$O_Y = \frac{R_o w_o}{2}\left(\frac{1}{R_A} - \frac{1}{R_C}\right)$$

In step 1260, the misalignment along the X-axis and/or the Y-axis is determined using the determined contact resistances and the equations set forth above. In an optional step 1270, it is possible to determine an error term by using known methods of solving for an overdetermined linear structure. As shown in FIG. 12, the contact resistances of the four probe members can be determined In step 1280, the process ends.

Figure 13:
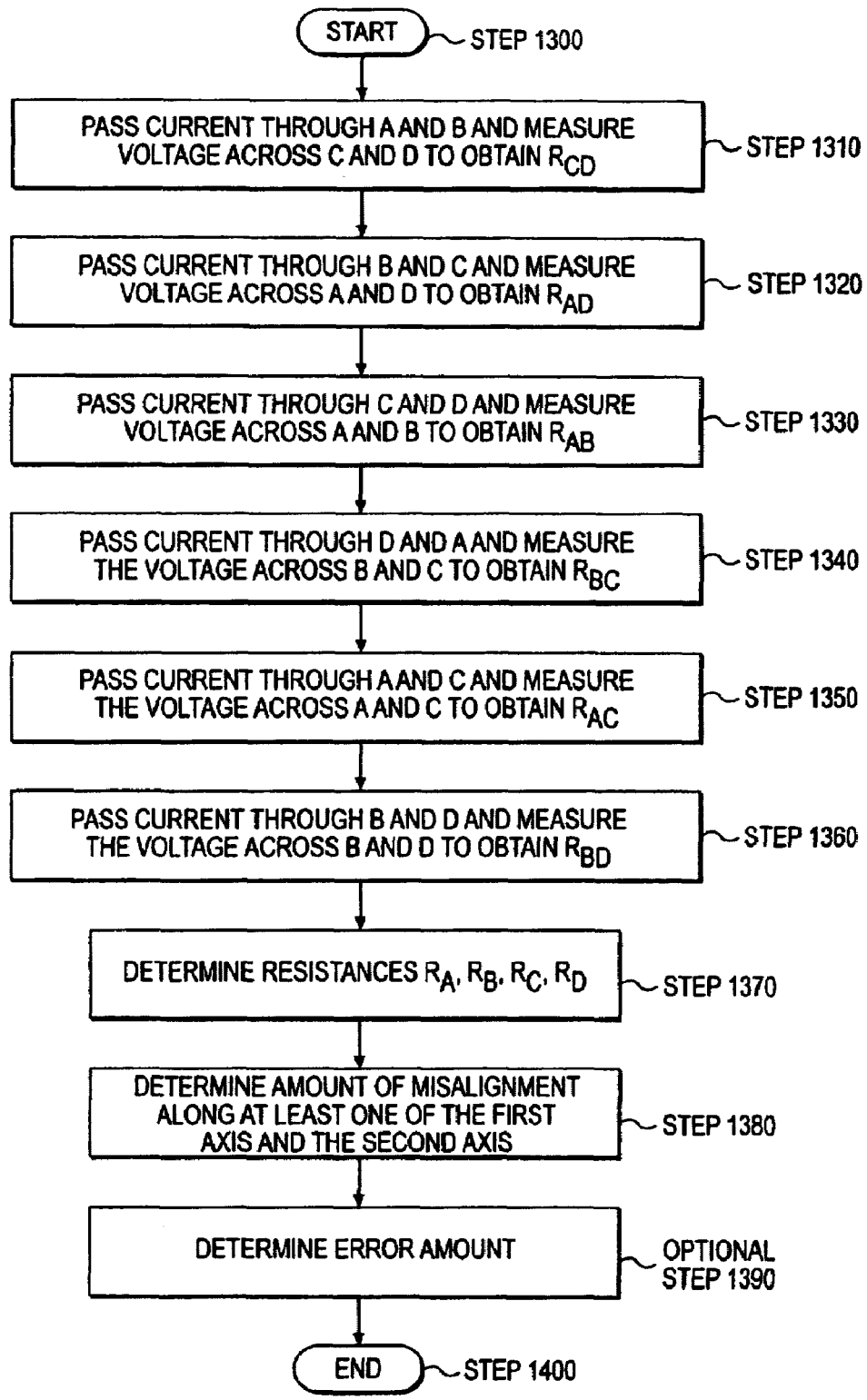
FIG. 13 illustrates a flow-chart outlining a method for determining an overlay shift according to this invention.

FIG. 13 illustrates a flow-chart outlining another method for determining an overlay shift according to this invention. In step 1300, the process starts. In step 1310, current $I_{AB}$ is passed from probe member A to probe member B and a first voltage $V_{CD}$ is measured across probe member D and probe member C in order to determine a first resistance $R_{CD}$. In step 1320, current $I_{BC}$ is passed from probe member B to probe member C and a second voltage $V_{AD}$ is measured across probe member A and probe member D in order to determine a second resistance $R_{AD}$. In step 1330, current $I_{CD}$ is passed from probe member C to probe member D and a third voltage $V_{AB}$ is measured across probe member A and probe member B in order to determine a third resistance $R_{AB}$. In step 1340, current $I_{DA}$ is passed from probe member D to probe member A and a third voltage $V_{BC}$ is measured across probe member B and probe member C in order to determine a third resistance $R_{BC}$. In step 1350, current $I_{AC}$ is passed from probe member A to probe member C in order to determine a fifth resistance $R_{AC}$ by measuring the voltage $V_{AC}$ across probe member A and probe member C to determine $R_{AC}$. In step 1360, current $I_{BD}$ is passed from probe member B to probe member D and a sixth voltage $V_{BD}$ is measured across probe member B and probe member D in order to determine $R_{BD}$. In step 1370, the resistance of the overlapping areas of each probe member with the overlay target are determined using the following matrices:

$$\begin{bmatrix} 1 & 1 & 0 & 0 \\ 0 & 1 & 1 & 0 \\ 0 & 0 & 1 & 1 \\ 1 & 0 & 0 & 1 \\ 1 & 0 & 1 & 0 \\ 0 & 1 & 0 & 0 \\ 1 & -1 & 1 & -1 \end{bmatrix} \begin{bmatrix} R_A \\ R_B \\ R_C \\ R_D \end{bmatrix} = \begin{bmatrix} R_{AB} \\ R_{BC} \\ R_{CD} \\ R_{AD} \\ R_{AC} \\ R_{BD} \\ 0 \end{bmatrix}$$

In step 1380 the misalignment along the X-axis and/or the Y-axis is determined using the determined contact resistances and the equations set forth above. In step 1390, it is possible to determine an error term by using known methods of solving for an overdetermined linear structure. In step 1400, the process ends.

Figure 14:
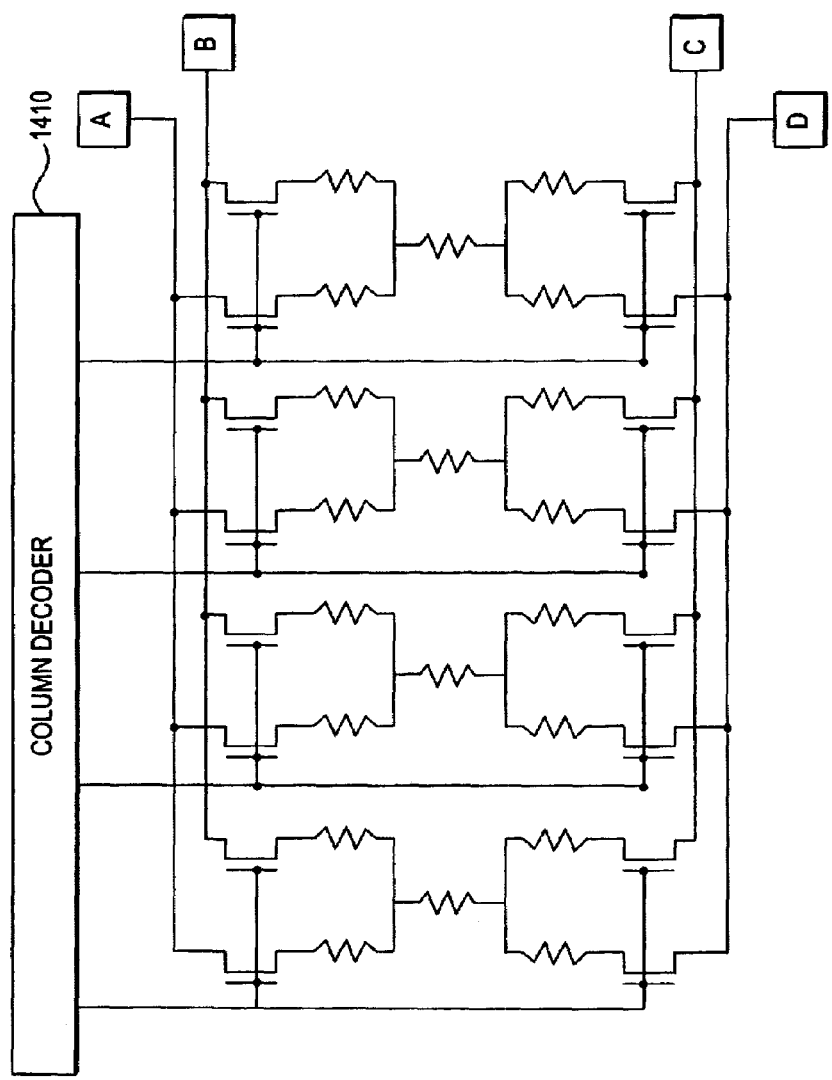
FIG. 14 illustrates an electrical diagram of an overlay shift determination structure according to this invention.

FIG. 14 illustrates an electrical diagram of an overlay shift determination structure according to this invention. As shown in FIG. 14, a plurality of overlay shift determination structures according to this invention may be used together in combination with a decoder 1410. As shown in FIG. 14, each of the probe members A, B, C, D are connected to each one of the plurality of overlay shift determination structures. The decoder allows for the selection of the overlay shift determination structure to be used.

The systems and methods according to this invention can be manufactured through standard microelectronic processes and can be integrated at several levels. For example, the shift overlay determination structure according to this invention can be provided to determine the alignment between any two layers of a semiconductor device.

While this invention has been described in conjunction with the embodiments outlined above, it is evident that many alternatives, modifications and variations will be apparent to those skilled in the art. Accordingly, the above-described-exemplary embodiments of systems and methods according to this invention, are intended to be illustrative, not limiting. Various changes may be made without departing from the spirit and scope of this invention.

The invention claimed is:

1. An overlay shift determination structure comprising: a plurality of probe members in a first layer, the first layer including a first axis and a second axis perpendicular to the first axis, a first probe member and a second probe member of the plurality of probe members being disposed along a first axis and a third probe member of the plurality of probe members being disposed perpendicular to the first probe member and the second probe member, a fourth probe member of the plurality of probe members being disposed perpendicular to the first probe member and the second probe member; and an overlay target in a second layer, at least a portion of each probe member of the plurality of probe members partially overlapping and being connected to the overlay target, wherein a current is applied across at least three pairs of probe members, wherein each pair of probe members comprises two of the first probe member, the second probe member, the third probe member and the fourth probe member; and a voltage is measured across at least three pairs of probe members.

2. The overlay shift determination structure according to claim 1, wherein each of the first layer and the second layer is a high resistance contact material.

3. The overlay shift determination structure according to claim 2, wherein the high resistance contact material is at least one of doped n-type Si, doped p-type Si, Tungsten, doped poly-Si, doped SiGe, doped GaAs.

4. The overlay shift determination structure according to claim 1, wherein the first layer is positioned directly above the second layer.

5. The overlay shift determination structure according to claim 1, wherein the second layer is positioned directly below the first layer.

6. The overlay shift determination structure according to claim 1, wherein: the current is sequentially applied across at least three pairs of probe members which are adjacent to each other; and the voltage is sequentially measured across at least three pairs of probe members at a time when the current is not being applied to the probe members in the pair across which the voltage is being measured at the time.

7. The overlay shift determination structure according to claim 6, wherein: the current is further sequentially applied across at least one of the two pairs of probe members comprising probe members which are aligned along one of the first axis; and the second axis and the voltage is further measured across the pair of probe members across which the current is being applied at the time.

8. The overlay shift determination structure according to claim 1, wherein the overlay shift determination structure is a plurality of overlay shift determination structures, wherein each of the plurality of overlay shift determination structures determines an overlay shift between any two layers of an integrated circuit.

9. The overlay shift determination structure according to claim 8, further comprising a decoder, wherein the decoder is used to determine which of the plurality of the overlay shift determination structures is used.

10. An overlay shift determination structure comprising: a plurality of probe members in a first layer, the first layer including a first axis and a second axis perpendicular to the first axis, a first probe member and a second probe member of the plurality of probe members being disposed along a first axis and a third probe member of the plurality of probe members being disposed perpendicular to the first probe member and the second probe member, a fourth probe member of the plurality of probe members being disposed perpendicular to the first probe member and the second probe member; and an overlay target in a second layer, at least a portion of each probe member of the plurality of probe members partially overlapping and being connected to the overlay target, wherein:

the third probe member and the fourth probe member are substantially symmetrically situated along the second axis, and a total resistance across the first axis is equivalent to a total resistance across the second axis; and a distance between an innermost point along an outside border of the first probe member in contact with the overlay target and an innermost point along an outside border of the second probe member in contact with the overlay target is substantially equal to a distance between an innermost point along an outside border of the third probe member in contact with the overlay target and an innermost point along an outside border of the fourth probe member in contact with the overlay target.

* * * * *